United States Patent
Hietala

[11] Patent Number: 5,357,222
[45] Date of Patent: Oct. 18, 1994

[54] VOLTAGE CONTROLLED COMPONENT INCLUDING A CAPACITIVE DIODE BIASED TO OPERATE IN THE LINEAR REGION

[75] Inventor: Seppo Hietala, Turko, Finland

[73] Assignee: Nokia Mobile Phones Ltd., Salo, Finland

[21] Appl. No.: 958,036

[22] Filed: Oct. 7, 1992

[30] Foreign Application Priority Data

Oct. 9, 1991 [FI] Finland ................................ 914763

[51] Int. Cl.$^5$ .................................................. H03B 7/12
[52] U.S. Cl. .................................... 332/124; 307/320;
307/271; 331/117 R; 331/117 D; 331/177 V;
332/129; 332/130; 332/136
[58] Field of Search ........................ 307/271, 320;
328/129.1, 142, 150, 151; 331/177 V, 117 D,
117 R; 332/124, 129, 130, 136

[56] References Cited

U.S. PATENT DOCUMENTS

| | | | |
|---|---|---|---|
| 4,003,009 | 1/1977 | Watanabe | 334/15 |
| 4,117,422 | 9/1978 | Hunt | 331/18 |
| 4,195,274 | 3/1980 | Suganuma | 307/320 |
| 4,494,090 | 1/1985 | Popek et al. | 332/16 T |
| 4,641,101 | 2/1987 | Selim | 328/25 |
| 4,721,926 | 1/1988 | Aota | 332/16 T |
| 4,721,927 | 1/1988 | Aota et al. | 332/16 T |
| 4,801,898 | 1/1989 | Obayashi | 331/132 |
| 4,835,492 | 5/1989 | Ikuhara et al. | 331/117 D |
| 5,027,429 | 6/1991 | Kojima | 455/113 |

FOREIGN PATENT DOCUMENTS

| | | |
|---|---|---|
| 2246607 | 9/1972 | Fed. Rep. of Germany . |
| 2251372 | 10/1972 | Fed. Rep. of Germany . |
| 2529013 | 6/1975 | Fed. Rep. of Germany . |
| 3204899 | 2/1982 | Fed. Rep. of Germany . |
| 914763 | 5/1992 | Finland . |
| 582446 | 11/1976 | Switzerland . |

*Primary Examiner*—Timothy P. Callahan
*Assistant Examiner*—Shawn Riley
*Attorney, Agent, or Firm*—Perman & Green

[57] ABSTRACT

The invention relates to a biased electronic circuit in which a voltage-controlled component has a characteristic with a non-linear portion and a substantially linear portion. The circuit is biased by a voltage being applied to one terminal of the component thereby shifting the operation of the component to the linear portion.

3 Claims, 3 Drawing Sheets

VOLTAGE CONTROLLED COMPONENT INCLUDING A CAPACITIVE DIODE BIASED TO OPERATE IN THE LINEAR REGION

The invention relates to an electronic circuit having a voltage controlled non-linear component which is biased into a linear portion of its response characterized by the application of a bias voltage. The invention is applicable particularly, but not exclusively, in a voltage controlled oscillator.

BACKGROUND OF THE INVENTION

When a component has a characteristic with a non-linear dependence on another characteristic it forms in many circuit applications a disadvantage which must be compensated for or minimized in some way. As an example of such a component we discuss in the following a capacitance diode being part of the frequency synthesizer in a radio telephone and having a typical characteristic curve as shown in FIG. 1.

FIG. 1 shows the variation 1 in capacitance of a capacitance diode as a function of the applied voltage. The capacitance diode provides the capacitance in the resonator in a voltage controlled oscillator (VCO). The capacitance value is controlled by a d.c. voltage, whereby the frequency of the resonator varies in relation to the capacitance. The capacitance of the capacitance diode has a non-linear dependence on the controlling d.c. voltage, which causes a deviation variation between different channels in the radiotelephone. At least two methods are commonly used to compensate for this non-linearity.

The first compensation method can be used if a sufficiently high battery voltage, over 9 V, is available in the device such as a mobile phone. When this battery voltage can be utilized so that the non-linear component is caused to operate in its more linear region, i.e. the region above 3 V according to the characteristic in FIG. 1.

Another widely used compensation method, is called programmable correction, which is predominant in radio telephones, particularly in devices such as handheld phones with a low battery voltage, below 7.2 V. Then the non-linear component must operate on the non-linear region of the capacitance/voltage-characteristic. Then the component causes a deviation variation between different channels in the radio telephone. It is well known to use programmable correction of this deviation variation, because the variation on each channel is known. The curve 2 in FIG. 2 shows the deviation variation for the channels in a radiotelephone as a function of the control voltage Vohj. The correct value of the deviation is indicated as the percentage, in relation to which the variation is shown. With programmable correction it ks possible to extend the control voltage region downwards, whereby a smaller VCO-factor is obtained.

An alternative to the use of programmable correction is to increase the control voltage above 3.0 V on the lowest channel, whereby the control voltage of the VCO can vary from 3 V to the regulated supply voltage. Then there is the problem of the small difference between the control voltage of the lowest channel and the regulated supply voltage of the synthesizer, which is typically 6 V. The whole frequency band of the oscillator has to be generated with the voltage difference, so that the method requires a large VCO-factor, over 10 MHz/V, and great accuracy in manufacture, so that the channel band control voltages can be adjusted between 3.0 V and the regulated supply voltage. This requires a margin of at least 0.5 V between the control voltage and the regulated supply voltage.

Thus the disadvantages of known compensation methods are the need to use a large VCO-factor, whereby phase noise and a noisy supply voltage cause inconveniences, and the great accuracy requirements on the production. There is also the disadvantage of a long setting time of the synthesizer, from the POWER OFF state to the desired channel.

SUMMARY OF THE INVENTION

According to the present invention there is provided an electronic circuit, for example a voltage controlled oscillator, including a voltage-controlled component having a response characteristic with a substantially linear portion and a non-linear portion, characterized by means for applying a bias voltage to the component to bias the component into the linear portion of the response characteristic.

The invention is based on the realization that the capacitance/voltage-characteristic of a non-linear component can be "shifted" in the voltage plane. Thus in a preferred embodiment biasing may be realized so that a negative d.c. voltage is supplied to one terminal of the component. Mathematically this means that the origin of FIG. 1 is shifted a desired amount to the right in the voltage plane. This shift equals the said negative d.c. voltage. Then the other terminal can be supplied with a lower voltage than without the biasing, but nevertheless the same capacitance value is achieved. Thus it is possible to operate on the linear region of the curve.

BRIEF DESCRIPTION OF THE DRAWINGS

An embodiment of the present invention is described, by way of example, with reference to the accompanying drawings, in which:

FIGS. 1 and 2 were described above in connection with the description of the prior art.

DETAILED DESCRIPTION OF THE INVENTION

Figure 1:
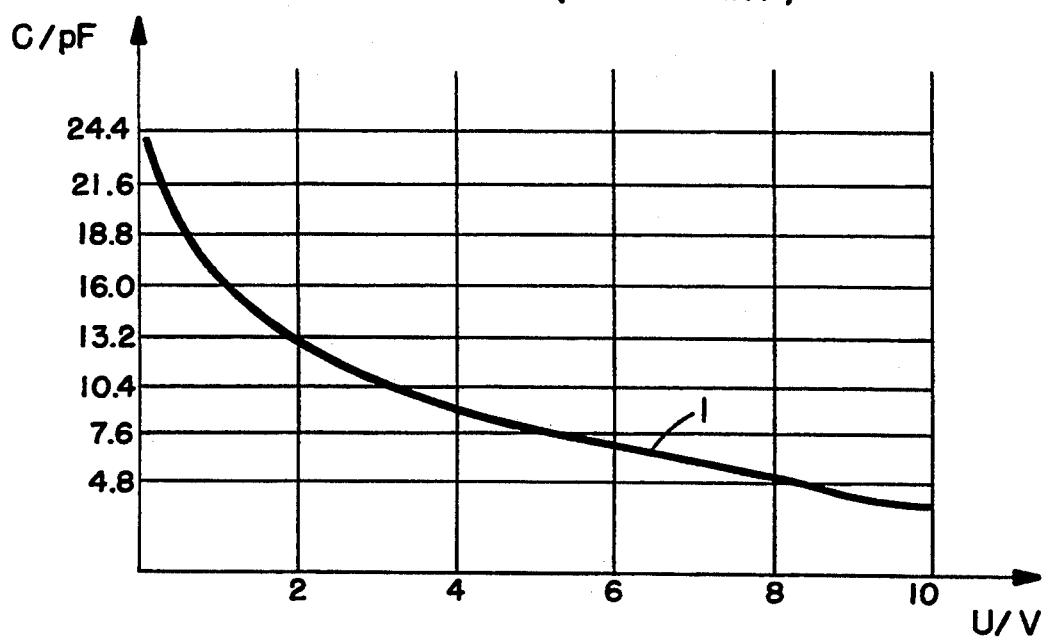
FIG. 1 shows the variation in capacitance of a non-linear component as a function of applied voltage in a prior art device.
Figure 2:
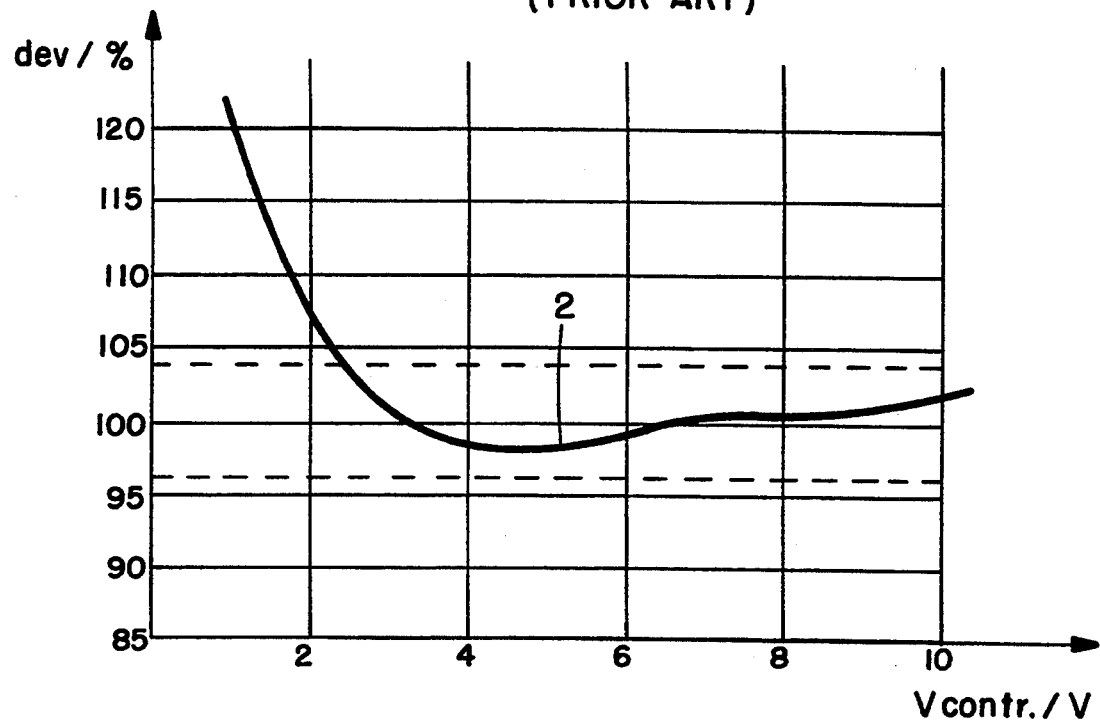
FIG. 2 shows the deviation variation for the transmission channels in a radio telephone as a function of the control voltage, when the synthesizer uses a component with the characteristic of FIG. 1.
Figure 3:
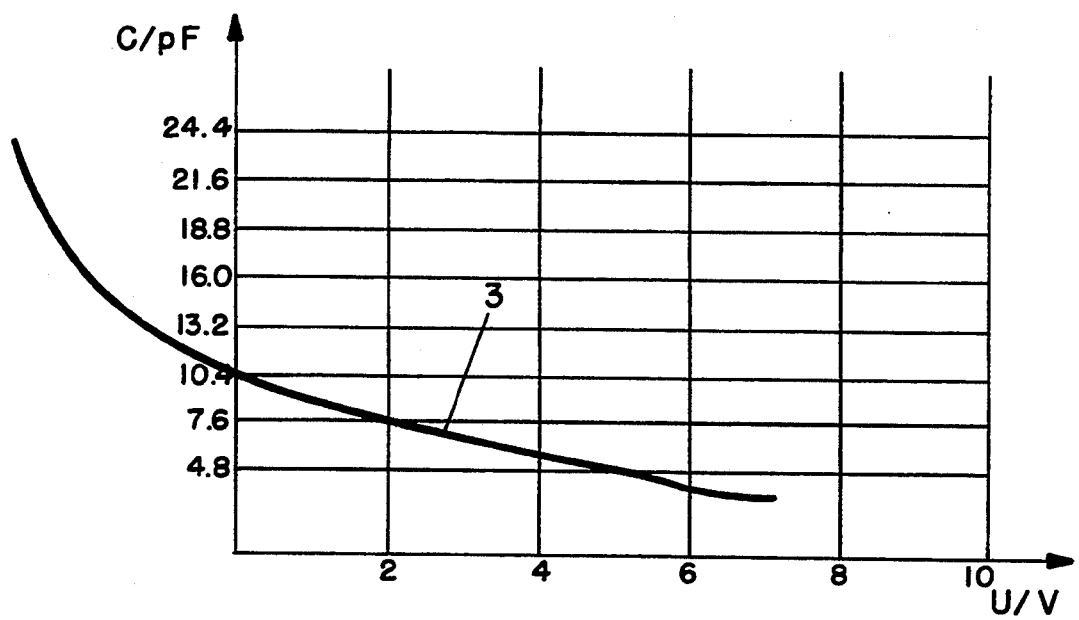
FIG. 3 shows the variation in capacitance of a non-linear component as a function of the applied voltage in an electronic circuit in accordance with the present invention.

If any block of the radio telephone can supply a negative voltage of suitable magnitude, the capacitance diode of the resonator circuit in the synthesizer is biased with this voltage. FIG. 3 shows the component's capacitance, curve 3, as a function of the control voltage (cathode voltage), when a bias voltage of about −3 V is supplied to the anode of the diode. The origin in FIG. 1 is now shifted to the right by an amount corresponding to the bias voltage, whereby the new characteristic curve is as shown in FIG. 3.

As the capacitance is affected only by the voltage over the diode, it is possible to achieve the same result with a low cathode voltage as would be achieved by using a high cathode voltage, if the anode is close to the earth potential of the circuit. The result is operation on the more linear part of the characteristic.

Figure 4:
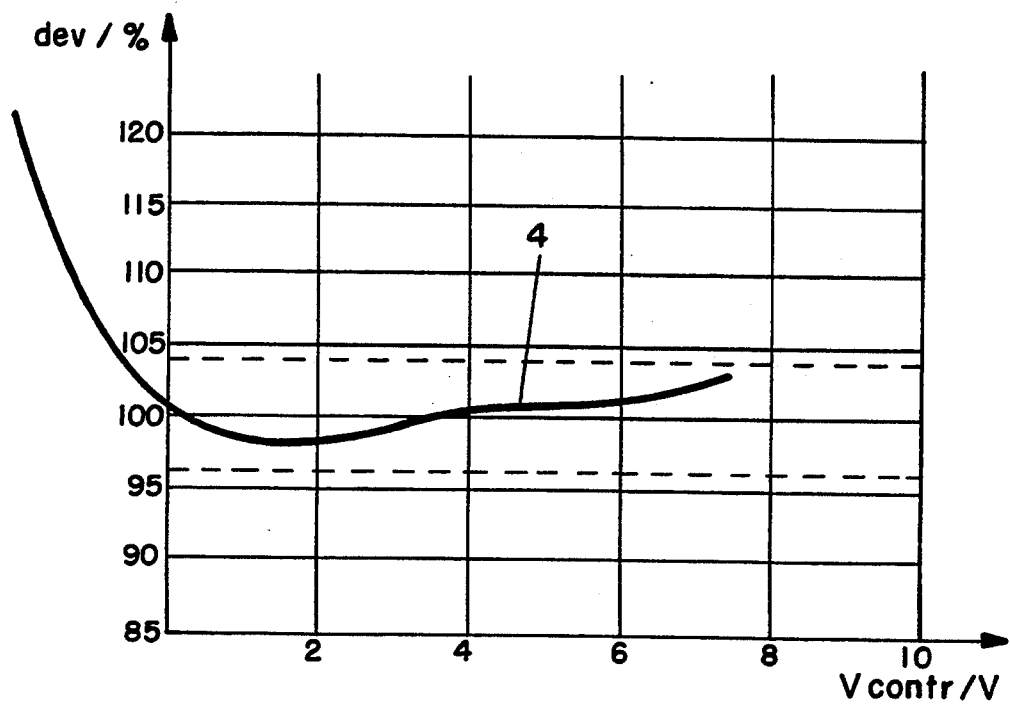
FIG. 4 shows the deviation variation using compensation in accordance with the present invention.

The deviation variation between different channels, which is caused by the voltage controlled non-linear component in the transmitter's synthesizer, is reduced by using a bias voltage according to the present invention, as the resonance frequency of the resonator in the VCO now varies in a linear way in accordance with the control voltage. FIG. 4 outlines the deviation variation 4 as a function of the control voltage using a bias of about $-3$ V.

Figure 5:
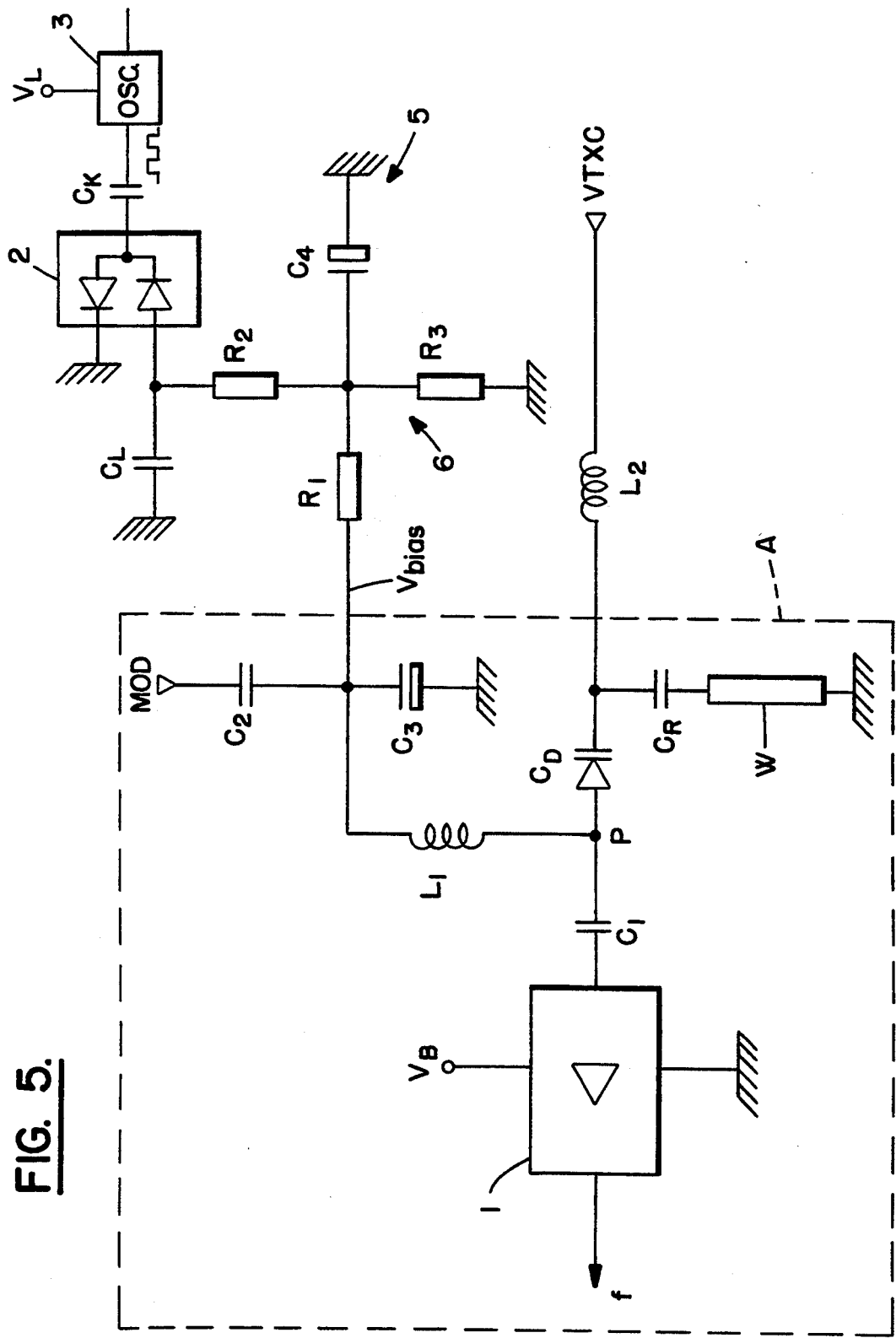
FIG. 5 is a basic circuit arrangement of a voltage controlled oscillator in accordance with the present invention.

FIG. 5 shows an electronic circuit in the form of a voltage controlled oscillator, which is part of the synthesizer circuit in a radio telephone, and which comprises a plurality of components including a voltage controlled component having a response characteristic with a substantially linear portion and a non linear portion. The non-linear component being a capacitance diode $C_D$. The circuit is characterized by means 5 for applying a bias voltage to the non-linear component to bias the component into the linear portion of the response characteristic.

In accordance with the present invention the block A indicated by the dashed lines represents any known VCO-circuit. It has a supply voltage $V_B$, and it comprises a transistor amplifier 1 and a resonator circuit comprising an inductance, e.g. a strip line W, and a capacitance, formed by the resonator capacitance $C_R$, the capacitance diode $C_D$, the coupling capacitance $C_1$ and the capacitance against the earth of the amplifier 1. The VCO has output frequency f. The output frequency can be controlled by supplying through the inductance $L_2$ to the cathode of the capacitance diode a d.c. voltage VTXC, the magnitude of which determines the capacitance of the capacitance diode $C_D$ and thus the resonance frequency of the resonator circuit and the output frequency f of the VCO. The output frequency f can be directly modulated so that a modulating signal MOD is supplied through the decoupling capacitor $C_2$ and the inductance $L_1$ to the anode of the capacitance diode at point P. The voltage applied over the capacitance diode varies with the signal MOD and thus the VCO output signal is frequency modulated. The above described is a prior art circuit and the principle is well known to a person skilled in the art.

The capacitance of the capacitance diode $C_D$ is determined according to the curve in FIG. 1, and because the potential at point P is essentially the earth potential of the circuit, this causes the disadvantages presented earlier. In accordance with the invention we proceed so that the point P supplied with a negative voltage of a suitable magnitude. Then the characteristic is shifted according to FIG. 3 and it is possible to use much lower values of control voltage VTXC in order to obtain the desired frequency f.

The means for applying a bias voltage includes means 2 and 6 for controlling the magnitude and polarity of the bias voltage.

The negative voltage $V_{bias}$ can be obtained at any suitable point in the radio telephone, if a negative voltage of a suitable magnitude is available. In the circuit of the figure we utilize the voltage $-3$ V, which is generated for the telephone's display. This voltage is generated by the oscillator circuit 3 from the supply voltage $V_L$. The oscillator generates a square wave with a positive peak almost equal to the supply voltage $V_L$ and a negative peak almost $-V_L$. This square wave charges the capacitor $C_K$ during the positive half-cycle. During the negative half-cycle the voltage of the capacitor $C_K$ is discharged through the lower diode of the diode pair 2. The discharge voltage is negative and the stabilizing capacitor $C_L$ keeps the negative voltage on the discharging line.

The desired negative voltage is selected with the voltage divider resistors R2 and R3 and supplied as the biasing voltage to the capacitance diode $C_D$ at point P, due to which it is possible to use low VTXC voltages. The large capacitors $C_4$ and $C_3$ stabilize the biasing voltage at point P.

If a battery voltage below 7.2 V is used, the biasing of the voltage controlled non-linear component enables control voltages just over 0.5 V without the need for programmable correction of the deviation variation. Then it is also possible to reduce the VCO-factor, thus avoiding the inconveniences caused by a large factor. At the same time the accuracy required of the production in the adjustment of the control voltages may be relieved.

The synthesizer settling time from the POWER OFF state to the desired channel is also made shorter, because the integrator can be charged to a lower potential. For example, now it is possible to reduce the VCO control voltage VTXC required to form the transmission channel with the lowest frequency from 3 V to 0.5 V. Then the frequency of the VCO in the POWER OFF state is much closer to the desired frequency. In order to get the desired channel the VCO control voltage must rise from 0 V to only 0.5 V.

Above we described how the bias voltage is generated from the voltage of the telephone's display, but it can be generated from a negative voltage of any other block in the telephone. If a negative voltage can not be directly obtained, it is also possible to design a separate circuit specifically for generating the bias voltage. The example describes a non-linear component, which is a capacitance diode of the VCO resonator circuit. The invention is neither limited to a synthesizer circuit, but it is applicable to any circuit, where it is desired to operate in the linear region of the non-linear component. The invention presents advantages particularly in increasing synthesizer speed as well as in the simple modifications of the soft-ware, where it is possible to omit the deviation correction which requires memory capacity.

In view of the foregoing it will be clear to a person skilled in the art that modifications and improvements may be incorporated without departing from the scope of the present invention.

I claim:

1. A voltage controlled oscillator (VCO) comprising:
   a voltage-controlled capacitance diode having first and second terminals and further exhibiting a capacitance voltage response characteristic which includes a linear portion and a nonlinear portion, said linear portion dependent upon an applied bias voltage;
   means for applying a bias voltage to said first terminal of said capacitance diode which causes said capacitance diode to operate in said linear portion;

means for applying a control voltage to said second terminal of said capacitance diode, said control voltage being of opposite polarity to said bias voltage; and modulation means for applying a modulation voltage to said first terminal of said capacitance diode which causes substantially linear changes in said capacitance of said capacitance diode in accord with changes in said modulation voltage, whereby an output frequency of said VCO exhibits substantially linear frequency changes in accord with changes in said modulation voltage.

2. The VCO as recited in claim 1, wherein said first terminal is an anode of said capacitance diode and said second terminal is a cathode of said capacitance diode, said bias voltage exhibiting a negative polarity and said control voltage exhibiting a positive polarity.

3. The VCO as recited in claim 1 wherein said VCO is incorporated in a radiotelephone and said bias voltage is derived from a rectified, filtered, oscillation signal present in said radiotelephone.

* * * * *